United States Patent [19]

Robinson et al.

[11] Patent Number: 4,677,642
[45] Date of Patent: Jun. 30, 1987

[54] APPARATUS AND METHOD FOR QUIESCENT CONTAINERLESS PROCESSING OF HIGH TEMPERATURE METALS AND ALLOYS IN LOW GRAVITY

[75] Inventors: Michael B. Robinson, Huntsville, Ala.; Lewis L. Lacy, The Woodlands, Tex.

[73] Assignee: The United States of America as represented by the Administrator of the National Aeronautics and Space Administration, Washington, D.C.

[21] Appl. No.: 805,010

[22] Filed: Dec. 5, 1985

[51] Int. Cl.$^4$ ............................................. H01J 37/305
[52] U.S. Cl. .......................................... 373/10; 373/15
[58] Field of Search ..................... 373/10, 11, 15, 17; 219/7.5, 121 EF, 121 EQ; 164/48; 250/427, 428

[56] References Cited

U.S. PATENT DOCUMENTS 2,686,864  8/1954  Wroughton et al. ................ 219/7.5

FOREIGN PATENT DOCUMENTS 1176772  8/1964  Fed. Rep. of Germany ........ 373/10

Primary Examiner—Roy N. Envall, Jr.
Attorney, Agent, or Firm—Joseph H. Beumer; John R. Manning; Leon D. Wofford, Jr.

[57] ABSTRACT

The electron bombardment furnace (B) consists of two confinement grid sections (26,28) which may be moved and separated from each other. Inside the bombardment furnace, a tungsten element (14) is enclosed. The material specimen (18) is located within the tungsten element and grounded by means of grounded support wires (20,22) connected to the respective sections of the furnace. The material specimen (18) is supported on the ground wires and heated by electron bombardment until melt occurs. The furnace sections are separated in opposite directions causing the ground wires to pull from the surfaces of the specimen, leaving the specimen freely suspended in the process chamber without the action of external forces. The specimen remains in its melt condition in the processing chamber where it can be undercooled without external forces acting on the specimen, which would cause dynamic nucleation.

20 Claims, 4 Drawing Figures

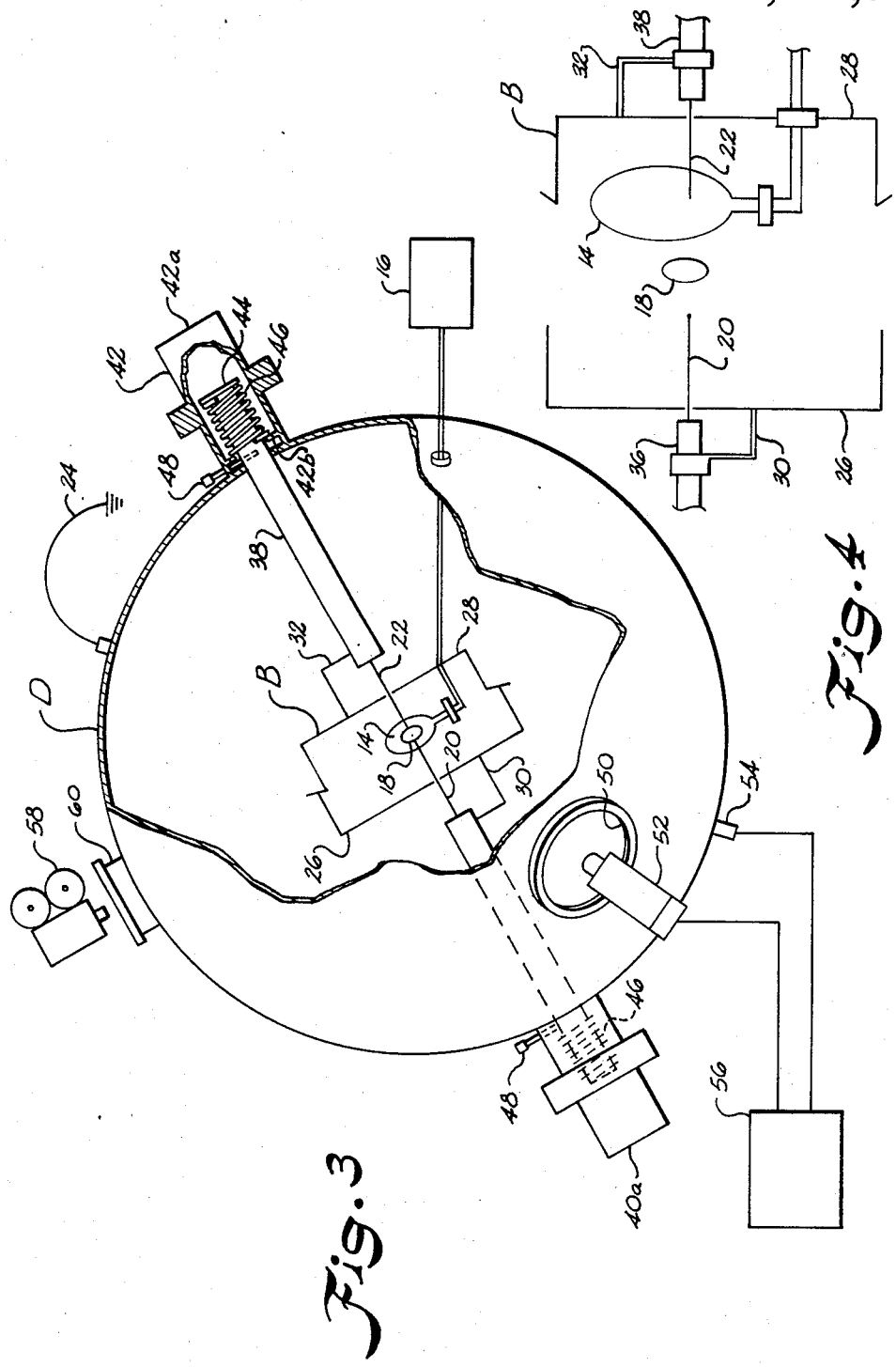

4,677,642

APPARATUS AND METHOD FOR QUIESCENT CONTAINERLESS PROCESSING OF HIGH TEMPERATURE METALS AND ALLOYS IN LOW GRAVITY

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The invention relates to the heating, melting, undercooling and solidification of high-melting temperature metals (1500 to 3000 degrees kelvin) and metal alloys in a containerless low gravity environment during space flight.

The device is particularly useful for preparing the various classes of metals, alloys and glasses which include metastable alloys and compounds; highly reactive metals, amorphous metals as well as conventional glasses and spherical single crystals.

Heretofore, apparatus and devices have been provided for low gravity containerless processes which have been classified into two groups, ground base and space flight type processes. Ground based processes for high temperature metals and alloys in a low gravity container less environment have been limited mainly to drop tubes. A drop tube is a long vertical tube in which molten samples are allowed to free fall through a cooling gas to enhance cooling rates. Undercoolings can not be directly measured but must instead must be estimated using complex cooling models. Drop tubes are for only short free fall and processing times on the order of less than five seconds.

Previous and current methods for containerlessly processing samples during a space flight may be grouped into two categories, electromagnetic levitators and acoustic levitators. Electromagnetic levitators operate by passing a high frequency oscillating current through a previously formed coil. An electromagnetic field is then set up inside the coil which can levitate a heated sample. In low gravity of space, the electromagnetic levitator is used to heat and position a sample. The sample is cooled by controlling the coil current or by passing a cooling gas through the coil and around the sample. To facilitate heating, an optional electron beam may be used with an electromagnetic levitator.

U.S. Pat. Nos. 3,476,170 and 3,363,081 describe electromagnetic levitators for use in round base systems which employ electromagnetic fields for levitation and melting. However, these devices induce varied stirrring in the sample and may therefore limit the degree of undercooling expected.

Acoustic levitators position the sample by use of resonant sound waves. To heat and melt a sample auxiliary heating must be used. Currently, all auxiliary heating is by laser, radiant energy or electron beam.

U.S. Pat. Nos. 3,365,184 and 3,270,118 are typical of the type apparatus which employ electron beam furnaces for the melting of material specimens which are not containerless or low gravity.

Another major disadvantage of the prior art devices is that operating temperatures have been limited below 1500 degrees Kelvin. Unfortunately, the more interesting alloy systems must be processed at temperatures above 1500 degrees Kelvin. These metal alloy systems include super alloys, refractory metals and alloys, most metallic glass systems, and pure metals with melting temperatures above 1500 degrees Kelvin.

While electromagnetic levitators have been used in systems where the temperatures have been above 1500 degrees Kelvin, these applications have been limited to ground base systems and not low gravity. These systems may also have the overriding problem that levitation by external forces can cause surface disturbances in the specimen resulting in dynamic nucleation or mechanical disturbance in the surface. This adversely affects the ability to undercool the specimen.

The advantages of undercooling are the following. In order to form non-equilibrium or metastable states within alloy systems, this can be done by simply increasing the solid solubility of the second constituent in an alloy or actually forming non-equlibrium crystal structures which can not be formed by slow cooling. This would offer the advantages of enhanced mechanical, electrical or superconducting properties.

Accordingly, an object of the present invention is to provide apparatus affording a quiescent containerless low gravity environment in space for undercooling and solidifying materials.

Another object of the present invention is to provide a quiescent containerless low gravity environment for heating, melting, undercooling and solidifying high temperature metals and metal alloys at temperatures above 1500 degrees Kelvin.

Still another object of the invention is to provide a quiescent containerless low gravity environment for processing high temperture metals and metal alloys in a low gravity space environment wherein the material specimens may be levitated without external forces which can cause dynamic nucleation and affect undercooling.

SUMMARY OF THE INVENTION

The above objections are accomplished according to the present invention by providing a containerless processing chamber in which an electron bombardment furnace is enclosed. The electron bombardment furnace consists of two sections which may be moved and separated from each other. Inside the bombardment furnace, a tungsten element is enclosed. The material specimen is located within the tungsten element and grounded by means of ground wires connected to respective sections of the furnace. The material specimen is supported on the ground wires and heated by electron bombardment until melt occurs. After complete melting occurs, the furnace sections are separated in opposite directions causing the ground wires to pull from the surfaces of the speciment leaving the specimen freely suspended in the process chamber without the action of external forces. In this manner, heating of the specimen occurs while attached to the ground wires. After which, the ground wires are pulled from the specimen and the specimen remains in its melt condition in the processing chamber where it can be undercooled while avoiding the action of external forces on the specimen, which could cause dynamic nucleation.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein:

FIG. 3 is a schematic illustration of apparatus for providing a quiescent containerless low gravity environment for the processing of high temperature metals and metal alloys in space; and FIG. 4 is a schematic illustration of the apparatus of FIG. 3 wherein the confinement grid is separated for removal of a specimen support wire from the supported specimen.

DESCRIPTION OF A PREFERRED EMBODIMENT

Figure 1:
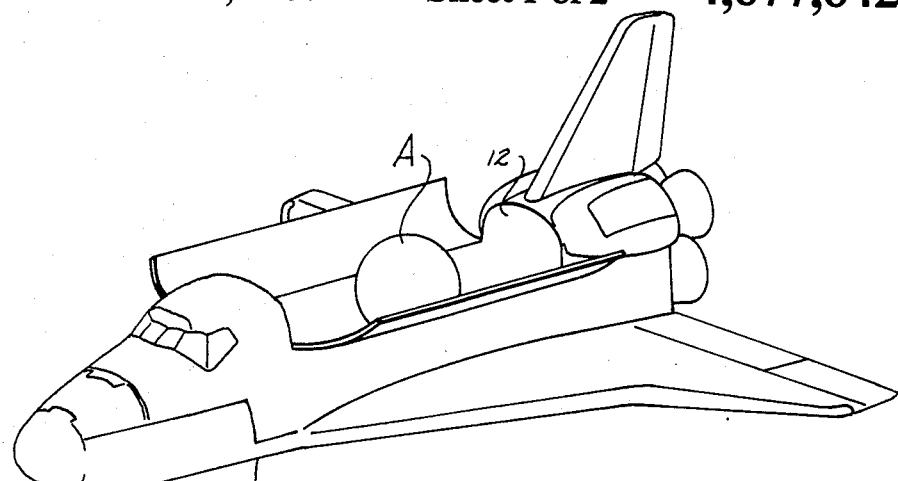
FIG. 1 is a perspective view illustrating application of the invention to an experiment in space in which the quiescent containerless processing apparatus is positioned within the payload bay of an orbiting space shuttle vehicle for conducting the processing of high temperature metals and metal alloys in the low gravity of space.

The invention relates to the processing of high temperature metals and metal alloys. In particular, the invention relates to the heating, melting, undercooling and solidification of these high melting temperature metals and metal alloys in a quiescent, containerless low gravity environment in space. For example, FIG. 1 illustrates apparatus designated as A for processing high temperature metals and metal alloys in a quiescent containerless environment in space which is on board a space shuttle vehicle 10. Such an experiment could possibly be one of the series of experiments scheduled for the Spacelab series of experiments in space. The apparatus A could be housed in the payload bay 12 of the orbiting space shuttle vehicle 10.

Figure 2:
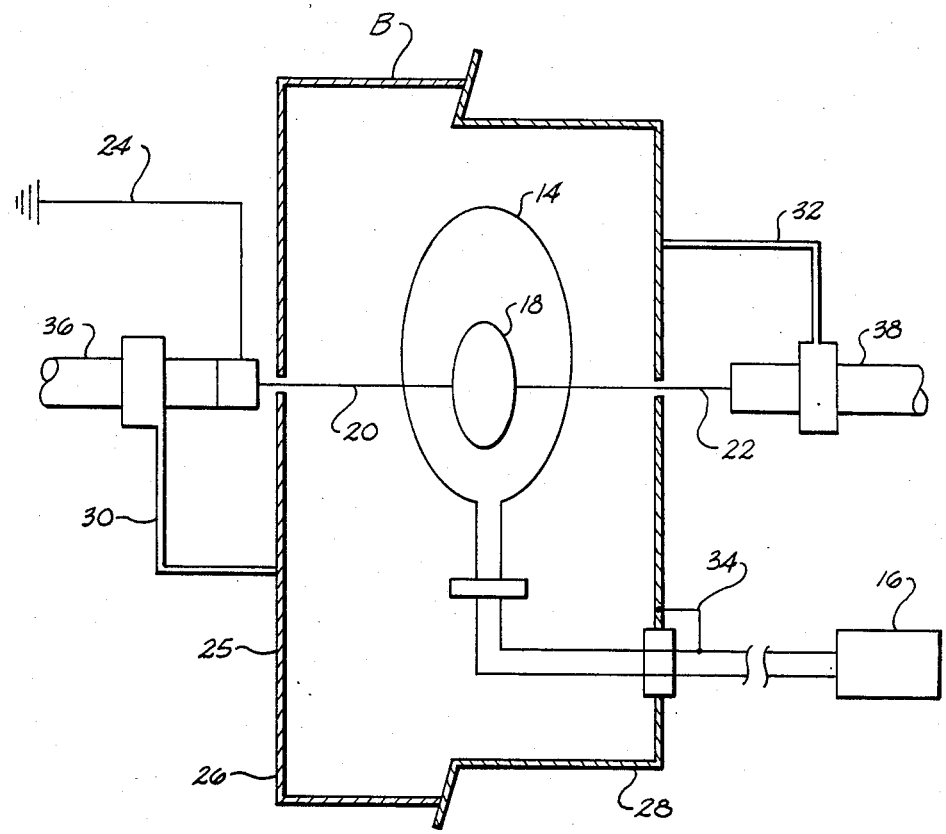
FIG. 2 is a schematic illustration of an electron bombardment furnace constructed in accordance with the present invention.

Referring now in more detail to the apparatus of the present invention, a schematic view of an electron bombardment furnace is illustrated in FIG. 2 for use in the apparatus of the present invention.

The electron bombardment furnace B includes an electron emission means in the form of a tungsten filament 14 which is held at a high negative potential (approximately two kilovolts) and powered by an external power supply 16, such as any conventional electron gun power supply. Electrons will be emitted from the tungsten filament 14 by thermionic emission and accelerated toward a specimen 18 of the metal or metal alloy being processed. Ground means for grounding the specimen 18 includes a pair of spceimen support wires 20 and 22. The specimen support wires 20 and 22 are grounded to an earth potential by an electrical groundwire 24.

Confinement means for confining the electrons includes a bisectional electron confinement grid 25 consisting of a first section 26 and a second section 28 fitted together to provide the confinement grid. This serves to confine the electrons and greatly increase the efficiency of the furnace. Each half section of the electronic confinement grid 25 is physically supported by a support arm. Support arm 30 supports grid section 26, and support arm 32 supports grid section 28. Both of these support arms 30 and 32 are held at the same negative potential as the tungsten filament by a electrical wire 34 connected to the tungsten element and the grid section 28.

Extraction means for removing the support wires 20, 22 from a melted specimen includes retraction rods 36 and 38. The support arm 30 is supported on retraction rod 36 and support arm 32 is carried on retraction rod 38. The retaction rods 36 and 38 are made from an insulating material such as fiberglass or any other suitable insulating material. Each support wire 20, 21 is fixed in its retraction rod and grounded by the groundwire 24.

In the method, electrons are accelerated toward and bombard the specimen 18 which is at ground potential. The energy of the electron bombardment heats and melts the specimen. Once the specimen is molten, it will be wet and cling to the support wires 20 and 22 by surface tension. The support wires may be made of the same material as the sample to avoid contamination or of a higher temperature material such as tungsten, tantalum, or boron nitride. Once specimen 18 is completely molten and/or overheated sufficiently, the support wire retraction mechanisms 40 and 42 are simultaneously activated. When the support wire mechanisms 40 and 42 are actuated, the retraction rods 36 and 38 are quickly retracted in directly opposite directions. This simultaneously separates the electron confinement grids 26 and 28 and removes the support wires from the specimen by pulling the wires in directly opposite directions. The specimen should, therefore, be left floating freely in the center of the containerless processing chamber D with virtually no residual velocity. Since the operation is carried out in low gravity the sample will remain fixed in the center of the chamber D. The two half sections of the electron bombardment furnace are retracted to the sides of the chamber D so as to not interfere with the sample.

Referring now to FIG. 3, a containerless processing chamber D is illustrated in which the electron bombardment furnace B is enclosed. The containerless processing chamber D is preferably in the form of a spherical enclosure while other suitable configurations may be utilized. On diametrically opposing sides, there are a pair of support wire retraction mechanisms carried by the processing chamber D. There is a left support wire retraction mechanism 40 carried on one side of the chamber and a right support wire retraction mechanism 42 carried on the right side of the chamber. Any suitable mechanical or electrical mechanism may be utilized as a support wire retraction mechanism 40 and 42. For example, the support wire retraction mechanisms may include slidably receiving the support rod 38 within a housing 42a and forming a flange 44 on an end of the support rod 38. A coiled compression spring 46 may be positioned on the support rod 38 with one end abutting the flange 44 and the other end abutting an abutment 42b in the front end of housing 42a. A pin 48 may lock the retraction rod 38 in its extended position in which the two grid sections 26 and 28 are held together. When it is desired to separate the two grid sections, the pin may be released, remotely, whereupon the compressed spring 46 will quickly move the retraction rod 38 to the right. The same will be true for the left retraction rod 36 whereupon the support wires 20 and 22 will be quickly separated from the sample, as can best be seen in FIG. 4.

There is an optical viewing port 50 formed in the spherical processing chamber D. An optical pyrometer 52 is ranged to view the sample 18 in the processing chamber through the optical viewport 50. An infrared detector 54 is carried by processing chamber D for detection of infrared radiation. Both the optical pyrometer and infrared detector are connected to a data acquisition system 56 which may be any suitable instrument for displaying the information from the pyrometer and infrared detector in terms of temperature and quietness. For example, a suitable voltmeter having its scale designed to show temperature and quietness may be utilized.

A highspeed motion picture camera 58 may be disposed above a viewing port 60 for recording of the experiment.

While a preferred embodiment of the invention has been described using specific terms, such description is for illustrative purposes only, and it is to be understood that changes and variations may be made without departing from the spirit or scope of the following claims.

What is claimed is:

1. Apparatus for the quiescent containerless processing of high-temperature metal and alloy materials in low gravity environment comprising:
   (a) grounded support means for supporting a specimen of said material in said environment and for grounding said specimen at a ground potential for processing;
   (b) electron emission means carried in said low gravity environment for emitting electrons in a manner in which said specimen is bombarded with electrons for heating and melting said specimen in a melt state;
   (c) confinement means carried in said environment substantially surrounding said electron emission means for confining said electrons and enhancing the bombardment of said specimen with said electrons; and
   (d) extraction means operatively connected to said grounded support means for removing said support means from said specimen upon said specimen being heated to said melt state whereby said specimen is freely suspended in said melt state in a manner in which said melted specimen is out of contact with a support or container surface in said low gravity environment.

2. The apparatus of claim 1 wherein said electron emission means includes a electron emission grid connected to a negative potential surrounding said supported specimen.

3. The apparatus of claim 1 wherein said support means comprises a grounded support wire means connected to earth potential on which said specimen is affixed and adheres by surfact tension in said melt state, said extraction means extracting said ground wire from said melted specimen by pulling and separating said support wire means from said specimen.

4. The apparatus of claim 3 wherein said support wire means includes a pair of first and second support wires with said specimen fixed to free ends of said support wires in a manner that said first and second support wires and said specimen are fixed together in an integral manner during heating and said support wires may be extracted from said specimen in said melt state and adhered thereto by surface tension.

5. The apparatus of claim 1 wherein said confinement means comprises a bisectional confinement grid carried at a negative potential surrounding electron emission grid.

6. The apparatus of claim 5 wherein said confinement grid consists of a first grid section carried on one side of said emission grid and a second grid section carried on an opposing side of said emission grid, said confinement grids being movable apart from each other in opposing directions in a manner not to interfere with said specimen when freely suspended in said melt state in said containerless low-gravity environment.

7. The apparatus of claim 6 wherein extraction means comprises means connecting said grounded support means to said first and second movable grid sections and means for retracting said first and second grid sections in opposing directions in a manner that said specimen support means is extracted from said specimen.

8. Apparatus for the quiescent containerless processing of high temperature metal and alloy materials in a low gravity environment comprising:
   (a) a grounded specimen support means for supporting a specimen of said material in said low gravity environment;
   (b) a furnace for heating and melting said specimen to a prescribed melt state including:
      (i) an electron emission grid for bombarding said specimen supported by said support means;
      (ii) a bisectional confinement grid for confining electron emissions to the area of said specimen within said low-gravity environment,
      (iii) a first grid section disposed on one side of said grounded specimen support means,
      (iv) a second grid section disposed on a second side of said grounded specimen support means, and
      (v) extraction means for moving said grid sections apart and for extracting said specimen support means from said specimen whereby said specimen remains in said melt state freely floating out of contact with any support or container medium in said low-gravity environment.

9. The apparatus of claim 8 wherein said emission grid and confinement grid are connected to a common negative potential.

10. The apparatus of claim 9 wherein said specimen support means includes support wire means connected to a ground potential and affixed to said specimen, said extraction means extracting and separating said support wire means from said specimen in said melt state to release said specimen previously adhered to said support wire means by surface tension in said melt state.

11. The apparatus of claim 10 wherein said support wire means includes a first support wire and a second support wire having free ends which are fixed together by said specimen affixed thereto prior to being heated; and
   said extraction means including a pair of reciprocating retraction rods connected to said support wires for pulling said support wires in opposing directions and extracting said support wires from said specimen in said melt state.

12. The apparatus of claim 8 including a power generator connected to said electron emission grid at a high negative potential.

13. The apparatus of claim 8 wherein said low gravity environment is provided within a chamber having a closure which encloses said specimen, specimen support means, electron emission grid, and confinement grid, said extraction means comprising a pair of retraction rods slidably carried by said chamber; and retraction mechanisms carried by said chamber for retracting said rods in opposing directions for removing said support means from said supported specimen.

14. A method of processing a high temperature metal or alloy material in a containerless environment comprising:
arranging said specimen in said environment;
supporting said specimen on an electrically conductive grounded specimen support;
heating said specimen to a melt state by bombardment with emitted electrons which are conducted to ground by said grounded support;
retracting said grounded specimen support when said specimen reaches said melt state and removing said specimen support from said melt state specimen in a manner that said specimen floats freely in said melt state out of contact with support of container surfaces in said environment.

15. The method of claim 14 including supporting said specimen by affixing said specimen to a grounded support wire and separating said support wire into two wires extracted from said specimen during support removal.

16. The method of claim 14 including providing an electron bombardment device surrounding said supported specimen for emitting said electrons and heating said specimen.

17. The method of claim 16 including arranging an electron confinement grid about said electron bombardment device to confine said emitted electrons for bombardment with said specimen.

18. The method of claim 16 including providing an electron confinement device for confining electrons which are emitted from said bombardment to the area of said specimen within said environment for effective heating and melting of said specimen which includes providing a first movable confinement section on one side of said supported specimen and a second movable confinement section on an opposing side of said supported specimen, and removing said specimen support from said specimen by movement of said confinement devices in opposing directions.

19. The method of claim 14 including heating and melting said specimen by arranging an electron bombardment grid about said supported specimen at a negative potential, and surrounding said electron bombardment grid with an electron confinement grid at said negative potential for confining said electrons within the area of said specimen for effective heating of said specimen.

20. The method of claim 18 including confining said emitted electrons by surrounding said electron bombardment device with a bisectional confinement grid having a pair of movable grid sections on opposing sides of said electron bombardment grid, and removing said specimen support by moving said pairs of grid sections apart.

* * * * *